(12) United States Patent
Wang

(10) Patent No.: US 9,668,351 B2
(45) Date of Patent: May 30, 2017

(54) PACKAGE CARRIER AND MANUFACTURING METHOD THEREOF

(71) Applicant: Subtron Technology Co., Ltd., Hsinchu County (TW)

(72) Inventor: Chao-Min Wang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 127 days.

(21) Appl. No.: 14/686,785

(22) Filed: Apr. 15, 2015

(65) Prior Publication Data
US 2016/0204054 A1  Jul. 14, 2016

(30) Foreign Application Priority Data

Jan. 13, 2015  (TW) .............................. 104101087 A

(51) Int. Cl.
*H05K 3/00* (2006.01)
*H05K 1/18* (2006.01)
(Continued)

(52) U.S. Cl.
CPC ......... *H05K 1/187* (2013.01); *H01L 21/4857* (2013.01); *H01L 21/6835* (2013.01); *H01L 23/49822* (2013.01); *H05K 3/007* (2013.01); *B32B 2439/00* (2013.01); *H01L 2221/68318* (2013.01); *H01L 2221/68345* (2013.01);
(Continued)

(58) Field of Classification Search
CPC ....... H05K 3/007; H05K 1/187; H05K 3/4682
See application file for complete search history.

(56) References Cited

U.S. PATENT DOCUMENTS 5,474,958 A * 12/1995 Djennas ................ H01L 21/565
257/676
7,346,982 B2 * 3/2008 Kim ...................... H05K 3/205
156/248
(Continued)

FOREIGN PATENT DOCUMENTS

| CN | 102804066 | 11/2012 |
| JP | 2008166534 | 7/2008 |

(Continued)

OTHER PUBLICATIONS

"Office Action of Japan Counterpart Application", issued on Aug. 23, 2016, p. 1-p. 3.

(Continued)

*Primary Examiner* — Jeremy C Norris
(74) *Attorney, Agent, or Firm* — Jianq Chyun IP Office

(57) ABSTRACT

A manufacturing method of a package carrier is provided. A carrier having a connecting surface is provided. A releasable solder resist layer is formed on the connecting surface of the carrier and completely covers the connecting surface. A substrate having an upper surface and a lower surface opposite to each other is provided. A first patterned solder resist layer is formed on the lower surfaces of the substrate and exposes a portion of the lower surface. The carrier and the substrate are laminated, the releasable solder resist layer directly contacts the first patterned solder resist layer, and the carrier is temporarily bonded to the first patterned solder resist layer through the releasable solder resist layer.

16 Claims, 4 Drawing Sheets

(51) Int. Cl.
*H01L 23/498* (2006.01)
*H01L 21/683* (2006.01)
*H01L 21/48* (2006.01)

(52) U.S. Cl.
CPC .............. *H01L 2221/68381* (2013.01); *H01L 2924/0002* (2013.01)

(56) References Cited

U.S. PATENT DOCUMENTS

2013/0243941 A1    9/2013   Lee et al.
2015/0092358 A1*   4/2015   Wang .................... H05K 3/007
                                                           361/748

FOREIGN PATENT DOCUMENTS

| JP | 2010087018 | 4/2010 |
| JP | 2012060112 | 3/2012 |
| JP | 2012088360 | 5/2012 |
| TW | I429043 | 3/2014 |

OTHER PUBLICATIONS

"Office Action of Taiwan Counterpart Application", issued on Nov. 25, 2016, p. 1-p. 8.

* cited by examiner

PACKAGE CARRIER AND MANUFACTURING METHOD THEREOF

CROSS-REFERENCE TO RELATED APPLICATION

This application claims the priority benefit of Taiwan application serial no. 104101087, filed on Jan. 13, 2015. The entirety of the above-mentioned patent application is hereby incorporated by reference herein and made a part of this specification.

BACKGROUND

Field of the Invention

The invention is directed to a substrate structure and a manufacturing method thereof and more particularly, to a package carrier and a manufacturing method thereof.

Description of Related Art

In a manufacturing method of a typical package carrier, a carrier is bonded to a substrate through a releasable copper foil layer, such that the carrier may serve as a support structure of the substrate, and after a manufacturing process of a chip package or multilayer wiring layers is subsequently completed on the substrate, the carrier is removed to form a package structure with a thinner thickness meeting nowadays requirements.

Currently, a method to remove the carrier includes separating the carrier from the substrate by means of peeling off and then cleaning the releasable copper foil layer left over on the substrate (which is referred to as a residual glue) by means of etching. However, during the etching process, not only the left-over releasable copper foil layer but also the wiring layers on the substrate are etched, and as a result, product structural reliability will be reduced.

SUMMARY

The invention provides a package carrier having better structural reliability.

The invention further provides a package carrier manufacturing method of manufacturing the package carrier.

According to an embodiment, the invention is directed to a manufacturing method of a package carrier which includes the following process steps. A carrier is provided, wherein the carrier has a connecting surface. A releasable solder resist layer is provided on the connecting surface of the carrier, wherein the releasable solder resist layer completely covers the connecting surface. A substrate is provided, wherein the substrate has an upper surface and a lower surface opposite to each other. A first patterned solder resist layer is formed on the lower surface of the substrate, wherein the first patterned solder resist layer exposes a portion of the lower surface. The carrier and the substrate are laminated, wherein the releasable solder resist layer directly contacts the first patterned solder resist layer, and the carrier is temporarily bonded to the first patterned solder resist layer through the releasable solder resist layer.

In an embodiment of the invention, the step of forming the releasable solder resist layer includes: forming a solder resist material layer on the connecting surface of the carrier, wherein a material of the solder resist material layer includes a thermal-curing solder resist material and a photo-curing solder resist material; and performing a photo curing process on the solder resist material layer to form the releasable solder resist layer.

In an embodiment of the invention, an irradiating energy of the photo curing process is 200 mJ/cm$^2$ to 1600 mJ/cm$^2$.

In an embodiment of the invention, the step of forming the first patterned solder resist layer includes: forming a first solder resist material layer on the lower surface of the substrate, wherein a material of the first solder resist material layer includes a thermal-curing solder resist material and a photo-curing solder resist material; performing a photo curing process and a thermal curing process on the first solder resist material layer to completely cure the first solder resist material layer; and patterning the first solder resist material layer to form the first patterned solder resist layer.

In an embodiment of the invention, the manufacturing method further includes: forming a second patterned solder resist layer on the upper surface of the substrate, wherein the second patterned solder resist layer exposes a portion of the upper surface.

In an embodiment of the invention, the manufacturing method further includes: before laminating the carrier and the substrate, forming a first surface treatment layer and a second surface treatment layer on the substrate, wherein the first surface treatment layer is disposed on the portion of the upper surface exposed by the second patterned solder resist layer, and the second surface treatment layer is disposed on the portion of the lower surface exposed by the first patterned solder resist layer.

In an embodiment of the invention, a temperature of laminating the carrier and the substrate is between 90° C. and 220° C.

In an embodiment of the invention, the carrier includes a core dielectric layer, a first copper foil layer and a second copper foil layer the first copper foil layer and the second copper foil layer are respectively disposed on two opposite sides of the core dielectric layer.

In an embodiment of the invention, the substrate includes a base, a first conductive layer and a second conductive layer, and the first conductive layer and the second conductive layer are respectively disposed on two opposite sides of the base.

In an embodiment of the invention, when the carrier and substrate are laminated, the releasable solder resist layer directly contacts the first patterned solder resist layer and covers the portion of the lower surface exposed by the first patterned solder resist layer.

According to an embodiment, the invention is directed to a package carrier, including a carrier, a releasable solder resist layer, a substrate and a first patterned solder resist layer. The carrier has a connecting surface. The releasable solder resist layer is disposed on the connecting surface of the carrier and completely covers the connecting surface. The substrate has an upper surface and a lower surface opposite to each other. The first patterned solder resist layer is disposed on the lower surface of the substrate and exposes a portion of the lower surface, wherein the carrier is temporarily bonded to the first patterned solder resist layer through the releasable solder resist layer.

In an embodiment of the invention, a material of the releasable solder resist layer includes a thermal-curing solder resist material and a photo-curing solder resist material, and the releasable solder resist layer is in a semi-cured state.

In an embodiment of the invention, a material of the first patterned solder resist layer includes a thermal-curing solder resist material and a photo-curing solder resist material, and the first patterned solder resist layer is in a completely cured state.

In an embodiment of the invention, the package carrier further includes a second patterned solder resist layer disposed on the upper surface of the substrate and exposes a portion of the upper surface.

In an embodiment of the invention, a material of the second patterned solder resist layer includes a thermal-curing solder resist material and a photo-curing solder resist material, and the second patterned solder resist layer is in a completely cured state.

In an embodiment of the invention, the carrier includes a core dielectric layer, a first copper foil layer and a second copper foil layer, and the first copper foil layer and the second copper foil layer are respectively disposed on two opposite sides of the core dielectric layer.

In an embodiment of the invention, the substrate includes a base, a first conductive layer and a second conductive layer, and the first conductive layer and the second conductive layer are respectively disposed on two opposite sides of the base.

In an embodiment of the invention, the releasable solder resist layer includes a plurality of protrusions, and the protrusions cover the portion of the lower surface exposed by the first patterned solder resist layer.

To sum up, in the package carrier of the invention, the carrier is temporarily bonded to the first patterned solder resist layer on the substrate through the releasable solder resist layer. Thus, after a manufacturing process of a chip package or multilayer wiring layers is subsequently completed on the substrate, the carrier can be separated from the substrate by means of directly peeling off from the substrate. Comparing with the related art where the carrier is peeled off, and then the releasable copper foil layer left over on the substrate is removed by means of etching, the manufacturing method of the package carrier of the invention can contribute to simplify the subsequently process steps, without occurring any issue with respect to the residual glue, such that the manufacturing cost can be effectively reduced, and the product reliability can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 1A through FIG. 1G are schematic cross-sectional diagrams illustrating a manufacturing method of a package carrier according to an embodiment of the invention. The manufacturing method of the package carrier according to the present embodiment. First, referring to FIG. 1A, a carrier 110 is provided, in which the carrier 110 has a connecting surface 111.

Figure 1A:
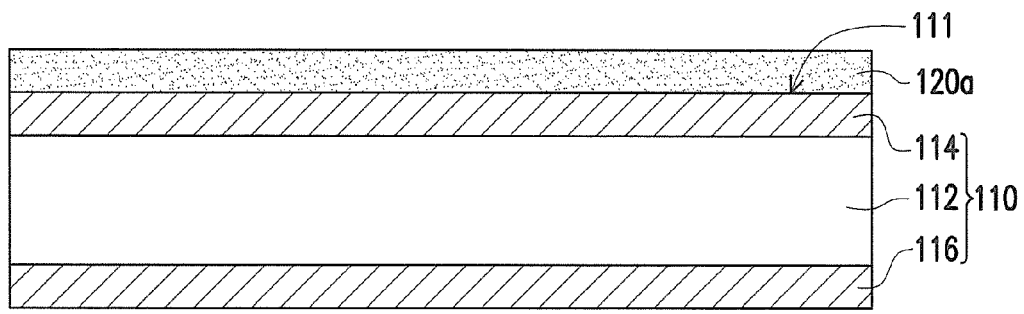
FIG. 1A through FIG. 1G are schematic cross-sectional diagrams illustrating a manufacturing method of a package carrier according to an embodiment of the invention.

In detail, referring to FIG. 1A, the carrier 110 of the present embodiment is formed by a core dielectric layer 112, a first copper foil layer 114 and a second copper foil layer 116, in which the first copper foil layer 114 and the second copper foil layer 116 are respectively located on two opposite sides of the core dielectric layer 112, but the invention is not limited to the structure.

Then, referring to FIG. 1A again, a solder resist material layer 120a is formed on the connecting surface 111 of the carrier 110, in which a material of the solder resist material layer 120a thermal-curing solder resist material and a photo-curing solder resist material. In this case, as shown in FIG. 1A, the solder resist material layer 120a is embodied as completely covering the connecting surface 111 of the carrier 110.

Figure 1B:
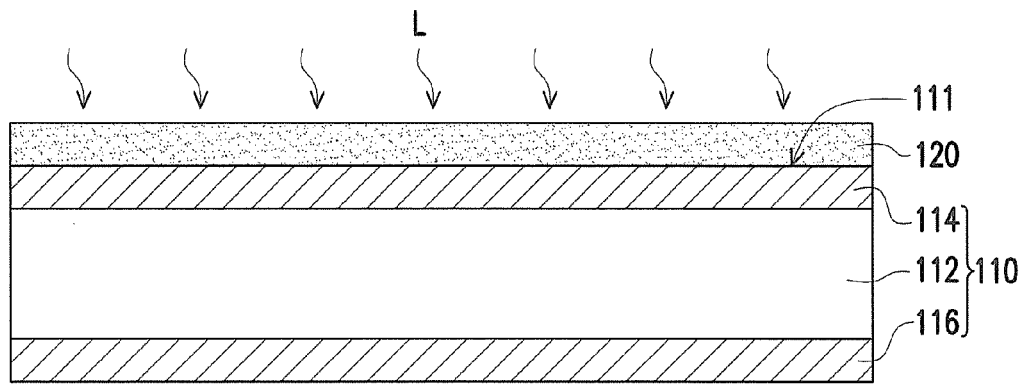

Afterwards, referring to FIG. 1B, a photo curing process is performed on the solder resist material layer 120a to form a releasable solder resist layer 120. In this case, the photo curing process may be performed by means of, for example, an irradiation process using ultraviolet (UV) light L, where an irradiating energy of the photo curing process is, for example, 200 mJ/cm$^2$ to 1600 mJ/cm$^2$. The solder resist material layer 120a of the present embodiment has both thermal-curing and photo-curing material characteristics, and thus, the releasable solder resist layer 120 formed by only performing the photo curing process is not completely cured. Namely, the formed releasable solder resist layer 120 is in a semi-cured state. In this circumstance, the releasable solder resist layer 120 completely covers the connecting surface 111 of the carrier 110.

Figure 1C:
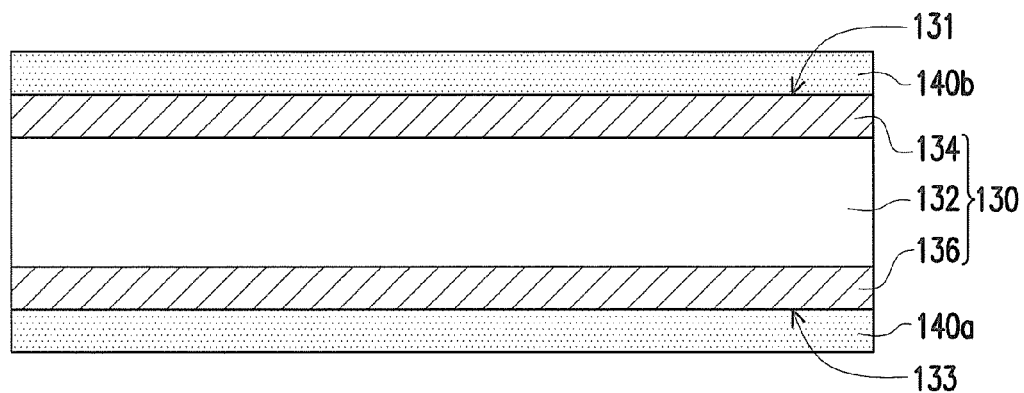

Then, referring to FIG. 1C, a substrate 130 is provided, in which the substrate 130 has an upper surface 131 and a lower surface 133 opposite to each other. In detail, the substrate 130 of the present embodiment is formed by a base 132, a first conductive layer 134 and a second conductive layer 136, in which the first conductive layer 134 and the second conductive layer 136 are respectively disposed on two opposite sides of the base 132.

Afterwards, referring to FIG. 1C again, a first solder resist material layer 140a is formed on the lower surface 133 of the substrate 130. If there is no other wiring layer to be manufactured subsequently, a second solder resist material layer 140b may also be formed on the upper surface of the substrate 130 while the first solder resist material layer 140a is formed. Namely, the manufacturing of the second solder resist material layer 140b is optional in this process step. Both a material of the first solder resist material layer 140a and a material of the second solder resist material layer 140b may include a thermal-curing solder resist material and a photo-curing solder resist material. Namely, both the first solder resist material layer 140b and the second solder resist material layer 140b have the thermal-curing and the photo-curing material characteristics. Certainly, in other embodiments, the material of the second solder resist material layer 140b may be different from the material of the first solder resist material layer 140a, which is still the technical solution adoptable by the invention and does not depart from the protection scope of the invention.

In the following step, the first solder resist material layer 140a and the second solder resist material layer 140b will be described as being simultaneously formed, for example, but the invention is not limited thereto.

Figure 1D:
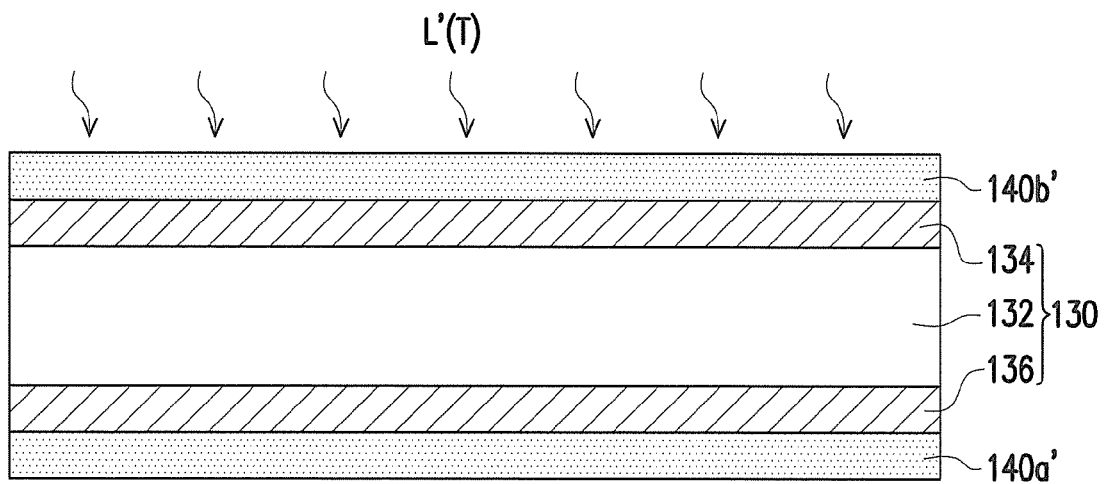

Then, referring to FIG. 1D, a photo curing process and a thermal curing process are performed on the first solder resist material layer 140a and the second solder resist material layer 140b to form a completely cured first solder resist material layer 140a' and a completely cured second solder resist material layer 140b'. Here, the photo curing process performs curing by means of, for example, an irradiation process using UV light L', where an irradiating energy of the photo curing process is, for example, 200 mJ/cm² to 1600 mJ/cm², while the thermal curing process performs curing by means of, for example, a heating process T, where a temperature of the heating process T is from 90° C. to 220° C., and a time period of the heating process T is from 30 to 120 minutes. Herein, the sequence of performing the photo curing process and the thermal curing process is not limited.

Figure 1E:
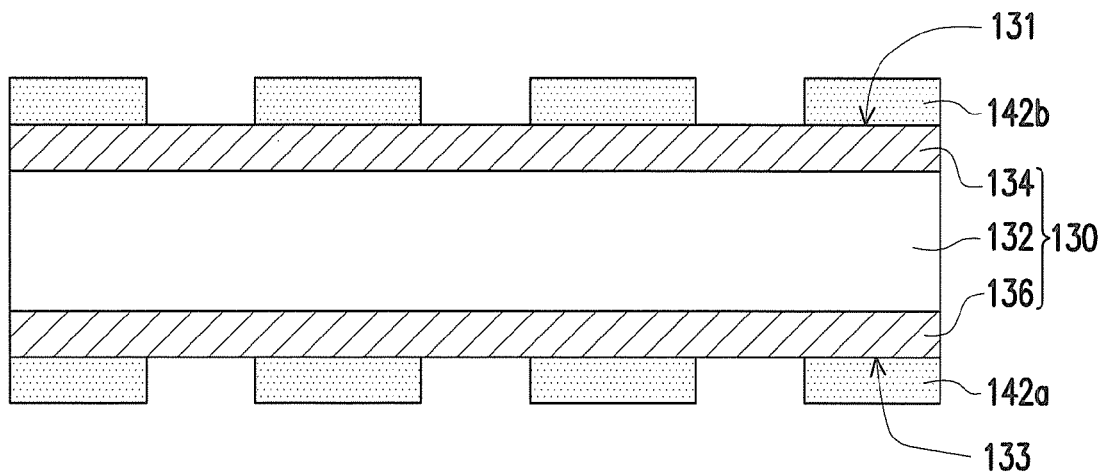

Then, referring to FIG. 1E, the first solder resist material layer 140a' and the second solder resist material layer 140b' are patterned to form a first patterned solder resist layer 142a and a second patterned solder resist layer 142b. In this circumstance, the first patterned solder resist layer 142a and the second patterned solder resist layer 142b are respectively formed on the lower surface 133 and the upper surface 131 of the substrate 130. The first patterned solder resist layer 142a and the second patterned solder resist layer 142b respectively expose a portion of the lower surface 133 and a portion of the upper surface 131. As shown in FIG. 1E, the first patterned solder resist layer 142a exposes a portion of the second conductive layer 136, and the second patterned solder resist layer 142b exposes a portion of the first conductive layer 134. In this circumstance, the first patterned solder resist layer 142a and the second patterned solder resist layer 142b are completely cured.

Figure 1F:
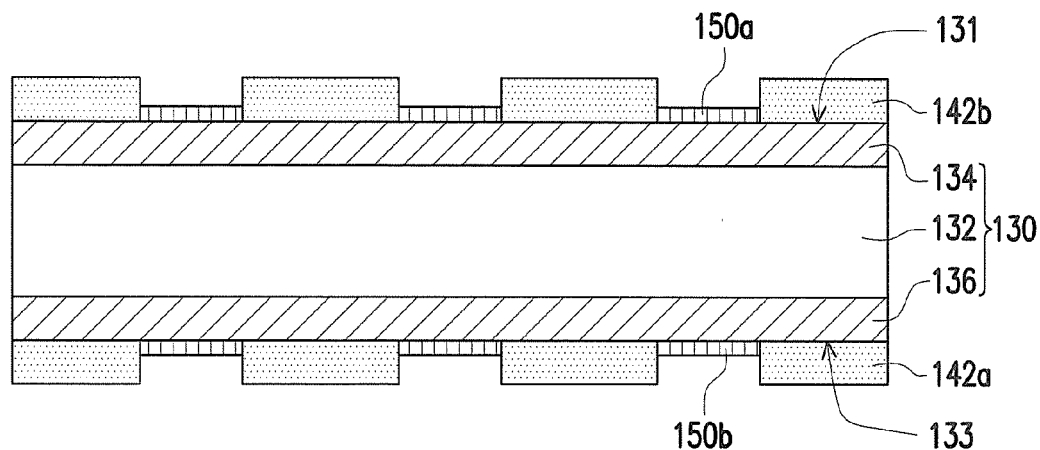

Then, in order to maintain the structural characteristics of first conductive layer 134 and the exposed second conductive layer 136, referring to FIG. 1F, a first surface treatment layer 150a and a second surface treatment layer 150b may also be formed on the substrate 130. The first surface treatment layer 150a is formed on the upper surface 131 exposed by the second patterned solder resist layer 142b, while the second surface treatment layer 150b is disposed on the lower surface 133 exposed by the first patterned solder resist layer 142a.

Figure 1G:
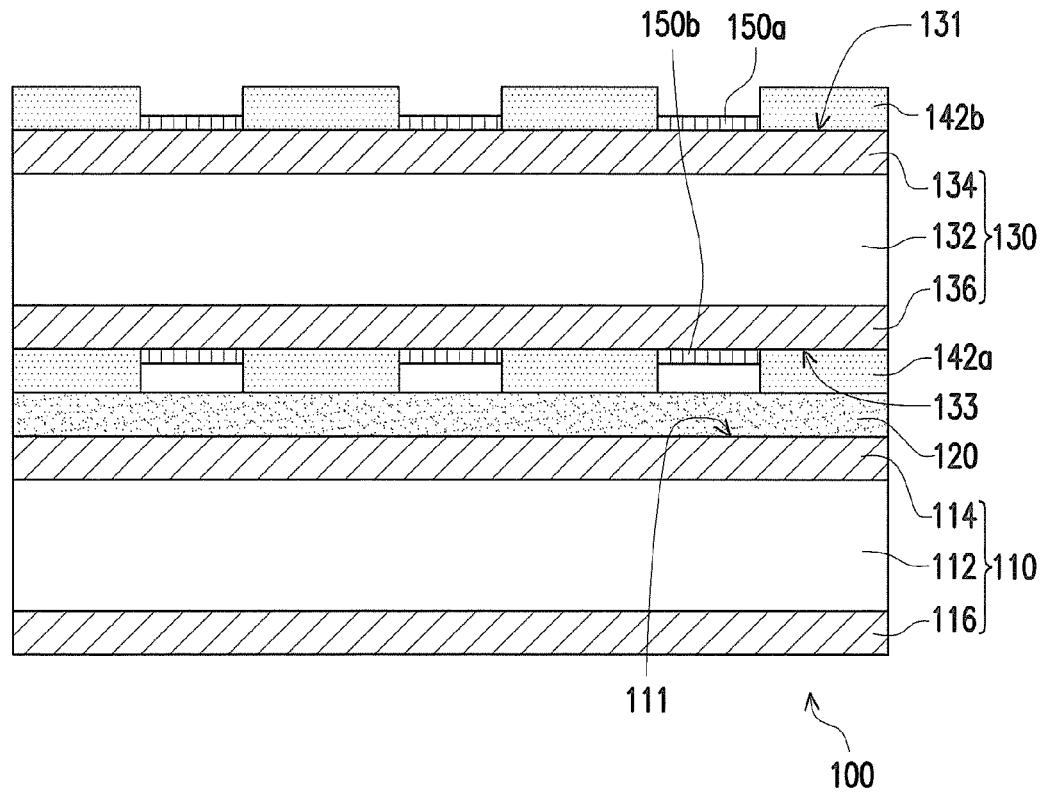

At last, referring to FIG. 1G, the carrier 110 and the substrate 130 are laminated, in which the releasable solder resist layer 120 directly contacts the first patterned solder resist layer 142a, and the carrier 110 is temporarily bonded to the first patterned solder resist layer 142a through the releasable solder resist layer 120. In this case, a temperature of laminating the carrier 110 and the substrate 130 is, for example, 90° C. to 220° C. So far, the manufacturing of the package carrier 100 is completed.

As for the structure, referring to FIG. 1G again, the package carrier 100 includes the carrier 110, the releasable solder resist layer 120, the substrate 130 and the first patterned solder resist layer 142a. The carrier 110 has the connecting surface 111. The releasable solder resist layer 120 is disposed on the connecting surface 111 of the carrier 110 and completely covers the connecting surface 111. The substrate 130 has the upper surface 131 and the lower surface 133 opposite to each other. The first patterned solder resist layer 142a is disposed on the lower surface 133 of the substrate 130 and exposes a portion of the lower surface 133, in which the carrier 110 is temporarily bonded to the first patterned solder resist layer 142a through the releasable solder resist layer 120.

In detail, the carrier 110 of the present embodiment is funned by the core dielectric layer 112 and the first copper foil layer 114 and the second copper foil layer 116 disposed on the opposite sides of the core dielectric layer 112. The substrate 130 is formed by the base 132 and the first conductive layer 134 and the second conductive layer 136 disposed on the opposite sides of the base 132. Specially, the releasable solder resist layer 120 is semi-cured, and a material of the releasable solder resist layer 120 includes, for example, a thermal-curing solder resist material and a photo-curing solder resist material. Besides, in order to protect the first conductive layer 134, the package carrier 100 may also include the second patterned solder resist layer 142b, in which the second patterned solder resist layer 142b is disposed on the upper surface 131 of the substrate 130 and exposes a portion of the upper surface 131.

The first patterned solder resist layer 142a and the second patterned solder resist layer 142b are completely cured, and the materials of both the first patterned solder resist layer 142a and the second patterned solder resist layer 142b are, for example, the thermal-curing solder resist material and the photo-curing solder resist material. In other words, the materials of the releasable solder resist layer 120, the first patterned solder resist layer 142a and the second patterned solder resist layer 142b are compositions of the thermal-curing and the photo-curing solder resist materials. Certainly, in other embodiments, the material of the second patterned solder resist layer 142b may be different from the material of the first patterned solder resist layer 142a, which still does not depart from the protection scope of the invention.

It should be noted that the package carrier 100 of the present embodiment is substantially a semi-manufactured structure and thus, a chip package process or a multilayer wiring layer process can be subsequently performed on the substrate 130. After the chip package process or the multilayer wiring layer process is completed, the carrier 110 and the substrate 130 can be separated from each other by means of peeling off since the carrier 110 and the substrate 130 of the package carrier 100 of the present embodiment are temporarily bonded to each other through the releasable solder resist layer 120. Based on the material characteristics of the releasable solder resist layer 120, no residual glue is left over on the substrate 130 in the peeling-off step, and therefore, no cleaning operation has to be performed through any other additional process.

Figure 2:
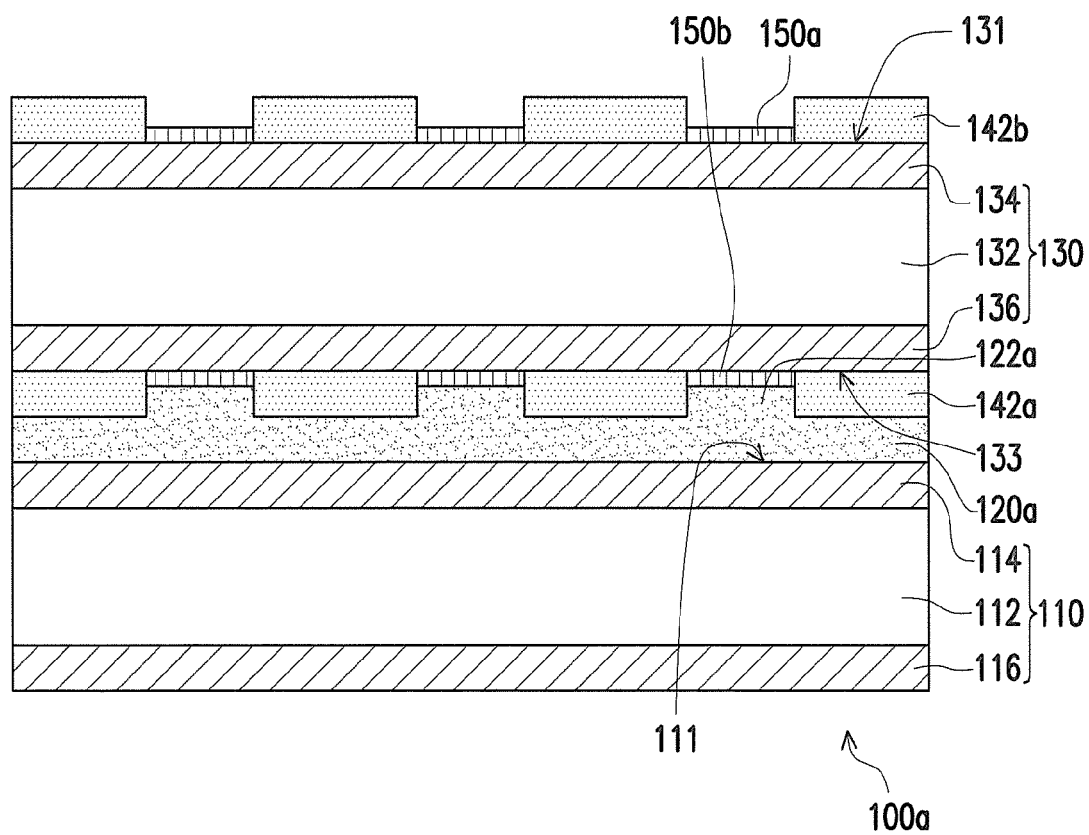
FIG. 2 is a schematic cross-sectional diagram illustrating a package carrier according to another embodiment of the invention.

Moreover, in another embodiment, in the step illustrated in FIG. 1B, the releasable solder resist layer 120a formed by performing the curing process on the solder resist material layer 120a is substantially incompletely cured. Thus, during the carrier 110 and the substrate 130 being laminated, the releasable solder resist layer 120a may directly contact the first patterned solder resist layer 142a and cover the portion of the lower surface 133 exposed by the first patterned solder resist layer 142a, which may refer to FIG. 2. In other words, the releasable solder resist layer 120a of the package carrier 100a may include a plurality of protrusions 122a, and the protrusions 122a cover the portion of the lower surface 133 exposed by the first patterned solder resist layer 142a. To be more specific, referring to FIG. 2, the protrusions 122a directly contacts the second surface treatment layer 150b and fill gaps in the first patterned solder resist layer 142a.

To summarize, in the package carrier of the invention, the carrier is temporarily bonded to the first patterned solder resist layer on the substrate through the releasable solder resist layer. Thus, after a manufacturing process of a chip package or multilayer wiring layers is subsequently completed on the substrate, the carrier and the substrate can be separated from each other by means of peeing off. Comparing with the related art where the carrier is peeled off, and then the releasable copper foil layer left over on the substrate is removed by means of etching, can contribute to simplify the subsequently process steps, without occurring any issue with respect to the residual glue, such that the manufacturing cost can be effectively reduced, and the product reliability can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package carrier, comprising:
    a carrier, having a connecting surface;
    a releasable solder resist layer, disposed on the connecting surface of the carrier and completely covering the connecting surface, wherein a material of the releasable solder resist layer comprises a thermal-curing solder resist material and a photo-curing solder resist material, and the releasable solder resist layer is in a semi-cured state;
    a substrate, having a upper surface and a lower surface opposite to each other; and
    a first patterned solder resist layer, disposed on the lower surface of the substrate and exposing a portion of the lower surface, wherein the carrier is temporarily bonded to the first patterned solder resist layer through the releasable solder resist layer.

2. The package carrier as recited in claim 1, wherein a material of the first patterned solder resist layer comprises a thermal-curing solder resist material and a photo-curing solder resist material, and the first patterned solder resist layer is in a completely cured state.

3. The package carrier as recited in claim 1, further comprising:
    a second patterned solder resist layer, disposed on the upper surface of the substrate and exposing a portion of the upper surface.

4. The package carrier as recited in claim 3, wherein a material of the second patterned solder resist layer comprises a thermal-curing solder resist material and a photo-curing solder resist material, and the second patterned solder resist layer is in a completely cured state.

5. The package carrier as recited in claim 1, wherein the carrier comprises a core dielectric layer, a first copper foil layer and a second copper foil layer, and the first copper foil layer and the second copper foil layer are respectively disposed on two opposite sides of the core dielectric layer.

6. The package carrier as recited in claim 1, wherein the substrate comprises a base, a first conductive layer and a second conductive layer, and the first conductive layer and the second conductive layer are respectively disposed on two opposite sides of the base.

7. The package carrier as recited in claim 1, wherein the releasable solder resist layer comprises a plurality of protrusions, and the protrusions cover the portion of the lower surface exposed by the first patterned solder resist layer.

8. A manufacturing method of a package carrier, comprising:
    providing a carrier, the carrier having a connecting surface;
    forming a solder resist material layer on the connecting surface of the carrier, wherein a material of the solder resist material layer comprises a thermal-curing solder resist material and a photo-curing solder resist material;
    performing a photo curing process on the solder resist material layer to form a releasable solder resist layer, wherein the releasable solder resist layer completely covers the connecting surface;
    providing a substrate, the substrate having an upper surface and a lower surface opposite to each other;
    forming a first patterned solder resist layer on the lower surface of the substrate, wherein the first patterned solder resist layer exposes a portion of the lower surface; and
    laminating the carrier and the substrate, wherein the releasable solder resist layer directly contacts the first patterned solder resist layer, and the carrier is temporarily bonded to the first patterned solder resist layer through the releasable solder resist layer.

9. The manufacturing method of the package carrier as recited in claim 1, wherein an irradiating energy of the photo curing process is 200 mJ/cm$^2$ to 1600 mJ/cm$^2$.

10. The manufacturing method of the package carrier as recited in claim 1, wherein the step of forming the first patterned solder resist layer comprises:
    forming a first solder resist material layer on the lower surface of the substrate, wherein a material of the first solder resist material layer comprises a thermal-curing solder resist material and a photo-curing solder resist material;
    performing a photo curing process and a thermal curing process on the first solder resist material layer to completely cure the first solder resist material layer; and
    patterning the first solder resist material layer to form the first patterned solder resist layer.

11. The manufacturing method of the package carrier as recited in claim 1, further comprising:
    forming a second patterned solder resist layer on the upper surface of the substrate, wherein the second patterned solder resist layer exposes a portion of the upper surface.

12. The manufacturing method of the package carrier as recited in claim 11, further comprising:
    before laminating the carrier and the substrate, forming a first surface treatment layer and a second surface treatment layer on the substrate, wherein the first surface treatment layer is disposed on the portion of the upper surface exposed by the second patterned solder resist layer, and the second surface treatment layer is disposed on the portion of the lower surface exposed by the first patterned solder resist layer.

13. The manufacturing method of the package carrier as recited in claim 1, wherein a temperature of laminating the carrier and the substrate is between 90° C. and 220° C.

14. The manufacturing method of the package carrier as recited in claim 1, wherein the carrier comprises a core dielectric layer, a first copper foil layer and a second copper foil layer, and the first copper foil layer and the second copper foil layer are respectively disposed on two opposite sides of the core dielectric layer.

15. The manufacturing method of the package carrier as recited in claim 1, wherein the substrate comprises a base, a first conductive layer and a second conductive layer, and the first conductive layer and the second conductive layer are respectively disposed on two opposite sides of the base.

16. The manufacturing method of the package carrier as recited in claim 1, wherein during laminating the carrier and the substrate, the releasable solder resist layer directly contacts the first patterned solder resist layer and covers the portion of the lower surface exposed by the first patterned solder resist layer.

* * * * *